United States Patent
Muhammad et al.

(10) Patent No.: US 9,461,660 B2
(45) Date of Patent: Oct. 4, 2016

(54) DIGITALLY-CORRECTED ANALOG-TO-DIGITAL CONVERTERS

(71) Applicant: Mediatek Inc., Hsin-Chu (TW)

(72) Inventors: Khurram Muhammad, Winston-Salem, NC (US); Chi-Lun Lo, Yangmei (TW); Frank Op 't Eynde, Wilsele (BE); Michael A. Ashburn, Jr., Groton, MA (US); Tien-Yu Lo, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/938,567

(22) Filed: Nov. 11, 2015

(65) Prior Publication Data
US 2016/0211856 A1 Jul. 21, 2016

Related U.S. Application Data

(60) Provisional application No. 62/105,449, filed on Jan. 20, 2015.

(51) Int. Cl.
*H03M 1/06* (2006.01)
*H03M 1/12* (2006.01)

(52) U.S. Cl.
CPC ......... *H03M 1/0626* (2013.01); *H03M 1/1255* (2013.01)

(58) Field of Classification Search
CPC ... H03M 1/0626; H03M 1/88; H03M 1/0658
USPC .......... 341/118, 120, 155, 157, 138
See application file for complete search history.

(56) References Cited

U.S. PATENT DOCUMENTS

| | | | |
|---|---|---|---|
| 4,554,514 A * | 11/1985 | Whartenby | H03F 1/3247 330/149 |
| 5,237,332 A | 8/1993 | Estrick et al. | |
| 8,760,333 B2 | 6/2014 | Op 't Eynde | |
| 2003/0195909 A1* | 10/2003 | Chan | H03H 17/0045 708/300 |

(Continued)

OTHER PUBLICATIONS

Kim, J. et al., "Analysis and Design of Voltage-Controlled Oscillator Based Analog-to-Digital Converter", IEEE Transactions on Circuits and Systems, Jan. 2010, pp. 18-30, Fig. 16.

(Continued)

*Primary Examiner* — Peguy Jean Pierre
(74) *Attorney, Agent, or Firm* — McClure, Qualey & Rodack, LLP

(57) ABSTRACT

A method and apparatus for a digitally-corrected analog-to-digital converter (ADC) are disclosed. The apparatus comprises a nonlinearity generator that generates one or more nonlinear characteristics of a time varying input signal and that causes unwanted signal components at frequencies other than a frequency of the time varying input signal, a frequency response modifier coupled to the nonlinearity generator that modifies the unwanted signal components by altering an amplitude of the unwanted signal components, a frequency response compensator coupled to the frequency response modifier, wherein the frequency response compensator compensates for the modification introduced by the frequency response modifier to provide a filtered digital signal, and an inverse nonlinearity generator coupled to the frequency response compensator for receiving the filtered digital signal, wherein the inverse nonlinearity generator compensates for the one or more nonlinear characteristics.

20 Claims, 8 Drawing Sheets

(56) References Cited

U.S. PATENT DOCUMENTS

| | | |
|---|---|---|
| 2010/0328125 A1 | 12/2010 | Pagnanelli |
| 2012/0098578 A1* | 4/2012 | Newton .................. H03L 7/093 327/156 |
| 2012/0194369 A1 | 8/2012 | Galton et al. |
| 2015/0180433 A1* | 6/2015 | Nakagawa ............... H03G 3/20 381/98 |
| 2015/0188555 A1 | 7/2015 | Kimura et al. |

OTHER PUBLICATIONS

Larson, L.E. et al., "Multibit Oversampled $\Sigma$-$\Delta$ A/D Convertor with Digital Error Correction", Electronics Letters, 24: 1051-1052, Aug. 1988.

* cited by examiner

DIGITALLY-CORRECTED ANALOG-TO-DIGITAL CONVERTERS

CROSS-REFERENCE TO RELATED APPLICATION

This application claims benefit under 35 USC 119(e) of U.S. Provisional Patent Application No. 62/105,449, filed on Jan. 20, 2015, entitled "DIGITALLY-CORRECTED ADC," which is incorporated herein by reference in its entirety.

FIELD OF THE INVENTION

The present invention relates generally to analog-to-digital converters (ADCs), and more specifically to multi-bit digitally-corrected ADCs.

BACKGROUND

Analog-to-digital converters (ADCs) are widely used in various electronics systems such as mobile phones, audio and video equipment, wireline communications systems, measurement equipment, and radar systems. ADCs are divided into ADCs with a single-bit Quantiser and ADCs with a multi-bit Quantiser. Multi-bit Quantisers suffer from nonidealities due to the nonlinear Quantiser characteristic. The nonidealities can result in gain error, offset error, increased Quantisation noise, and signal distortion errors. Therefore, there is a strong need for a solution that overcomes the aforementioned issues. The present invention addresses such a need.

SUMMARY OF THE INVENTION

A method and apparatus for a digitally-corrected analog-to-digital converter (ADC) are disclosed. The apparatus comprises a nonlinearity generator that generates one or more nonlinear characteristics of a time varying input signal and that causes unwanted signal components at frequencies other than a frequency of the time varying input signal, a frequency response modifier coupled to the nonlinearity generator that modifies the unwanted signal components by altering an amplitude of the unwanted signal components, a frequency response compensator coupled to the frequency response modifier, wherein the frequency response compensator compensates for the modification introduced by the frequency response modifier to provide a filtered digital signal, and an inverse nonlinearity generator coupled to the frequency response compensator for receiving the filtered digital signal, wherein the inverse nonlinearity generator compensates for the one or more nonlinear characteristics.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates generally to analog-to-digital (ADC) converters, and more specifically to multi-bit digitally-corrected ADC converters. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Conventional analog-to-digital converters (ADCs) with a multi-bit Quantiser suffer from nonidealities due to a nonlinear Quantiser characteristic that can lead to gain error, offset error, increased Quantisation noise, and signal distortion errors. Several correction methods can be utilized to overcome many of the effects resulting from the nonlinear Quantiser characteristic. For example, dynamic element matching allows converting the signal distortion into noise. Alternatively, the nonlinear Quantiser characteristic can be measured and stored in digital or analog memories. The stored values can be used later to perform a correction during the analog-to-digital conversion.

Voltage controlled oscillator (VCO)-based analog-to-digital converters (ADCs) are a class of ADCs with the multi-bit Quantiser. The Quantiser characteristic is nonlinear but monotonous and can be compensated for using a digital post-correction mechanism. In one embodiment, the digital post-correction mechanism is based on a digital lookup table that stores correction values. The digital post-correction mechanism adds an additional nonlinearity to the ADC which can compensate the initial Quantiser nonlinearity, resulting in more of an overall linear ADC.

Figure 1:
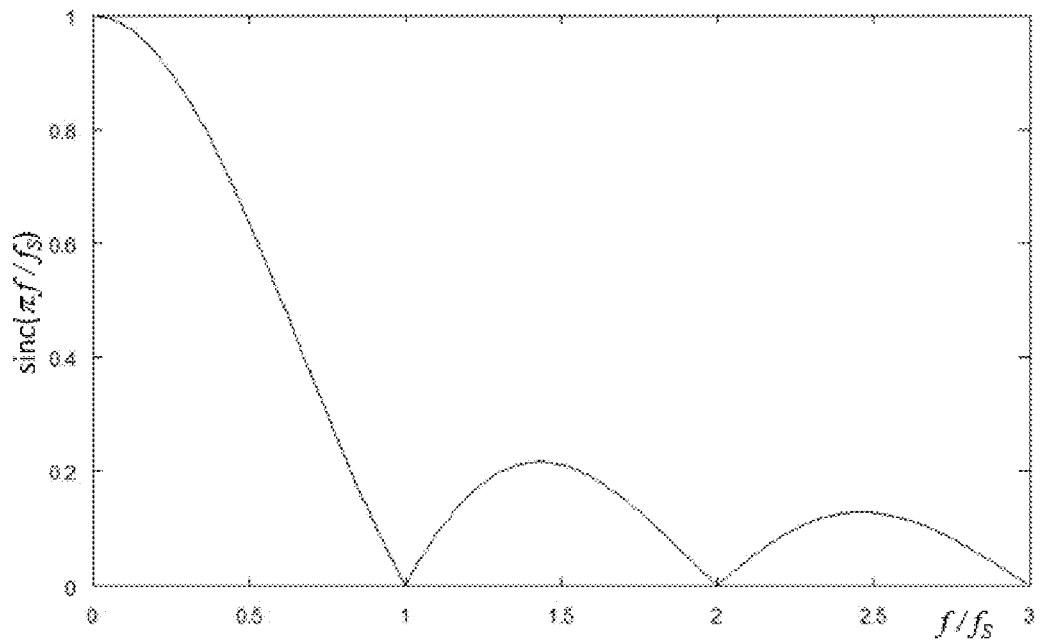
FIG. 1 illustrates a diagram of a sinc-filter characteristic associated with a filtering function in accordance with an embodiment.
Figure 1:
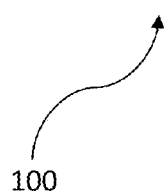

Some ADCs, including but not limited to continuous-time sigma-delta modulators and VCO-based ADCs, perform an averaging of the input signal during each conversion period, prior to the analog-to-digital conversion itself. The averaging corresponds to a lowpass filtering in the frequency domain with a filtering function using a sinc-filter and is given by the following equation $$|H(f)| = \frac{|\sin(\pi \cdot f / f_s)|}{\pi \cdot f / f_s}, \quad (1)$$

also denoted sometimes as $|H(f)|=\text{sinc}(\pi \cdot f/f_s)$, where $f_s$ is the sampling frequency of the ADC. The signal attenuation due to the sinc-filter is frequency-dependent. FIG. 1 illustrates a diagram 100 of a sinc-filter characteristic associated with a filtering function in accordance with an embodiment.

A digital compensation of the nonlinear Quantiser characteristic using correction values stored in a digital lookup table measures the nonlinearity upfront to determine the required correction values. The nonlinearity is measured by applying a number of direct current (DC) calibration signals to the ADC input and reading out the corresponding ADC output signals. When, after such calibration, a time-varying signal is applied to the ADC inputs, the nonlinear Quantiser characteristic causes signal distortion, resulting in Harmonic distortion and/or intermodulation distortion. The signal distortion results in unwanted distortion signal components at various frequencies, other than the original input signal frequencies.

When the ADC performs signal filtering, including but not limited to a sinc-filter function, the unwanted distortion signal components are subjected to filter attenuations that are generally different from the filter attenuations seen by the original input signal components. Therefore, post-filtering, the ratios between the amplitudes of the unwanted distortion signal components and the amplitudes of the original input signal components can be different from the ratios pre-filtering, and are frequency-dependent.

In one embodiment, the ADC contains a digital post-distortion cancelling/correction mechanism that is based on correction coefficients that are derived from a calibration with DC calibration signals. The digital post-distortion cancelling mechanism generates additional distortion signal components with amplitudes that are equal but of the opposite sign to the amplitudes of the unwanted distortion signal components. However, the additional distortion signal components do not perfectly and/or completely cancel out the unwanted distortion signal components to restore the desired undistorted signal because the amplitudes of the unwanted distortion signal components (from the inputs of the ADC) are filtered or altered before entering the digital post-distortion cancelling mechanism.

As used herein, "perfectly" and/or "completely" cancelling out or compensating for the unwanted distortion signal components (as well as a perfect or complete cancellation or compensation) are defined as substantially and/or nearly fully cancelling out or compensating for the unwanted distortion signal components to enable an overall linear ADC.

Ideally the additional distortion signal components should be of equal magnitude but of opposite sign to the unwanted signal distortion components. However, typically the additional distortion signal components generated by the digital post-distortion cancelling mechanism are not of equal magnitude to the unwanted distortion signal components outputted by the ADC. This is the root cause of an incomplete or imperfect cancellation of signal distortion components. Therefore, in this embodiment, substantial distortion components typically persist even after using the distortion cancelling of the digital post-distortion cancelling mechanism. As a result, the remaining ADC nonlinearity will be frequency-dependent and a perfect or complete distortion cancelling might occur only for DC input signals.

In another embodiment, the integrated circuit that the ADC is integrated within (or the ADC unit itself) further includes an inverse-sinc filter that is coupled to the digital post-distortion cancelling mechanism (digital post-correction mechanism). The addition of the inverse-sinc filter eliminates the distortion components that lead to incomplete cancellation by providing additional distortion signal components that are equal to the unwanted distortion signal components thereby providing a perfect distortion canceling for numerous types of signals (and not just DC input signals as is the case in the aforementioned type of ADC). A method and system in accordance with the present invention provides distortion cancelling using a digital post-distortion cancelling mechanism even in the presence of a filter including but not limited to a sinc-filter.

To describe the features of the present invention in more detail, refer now to the following description in conjunction with the accompanying Figures.

Figure 2:
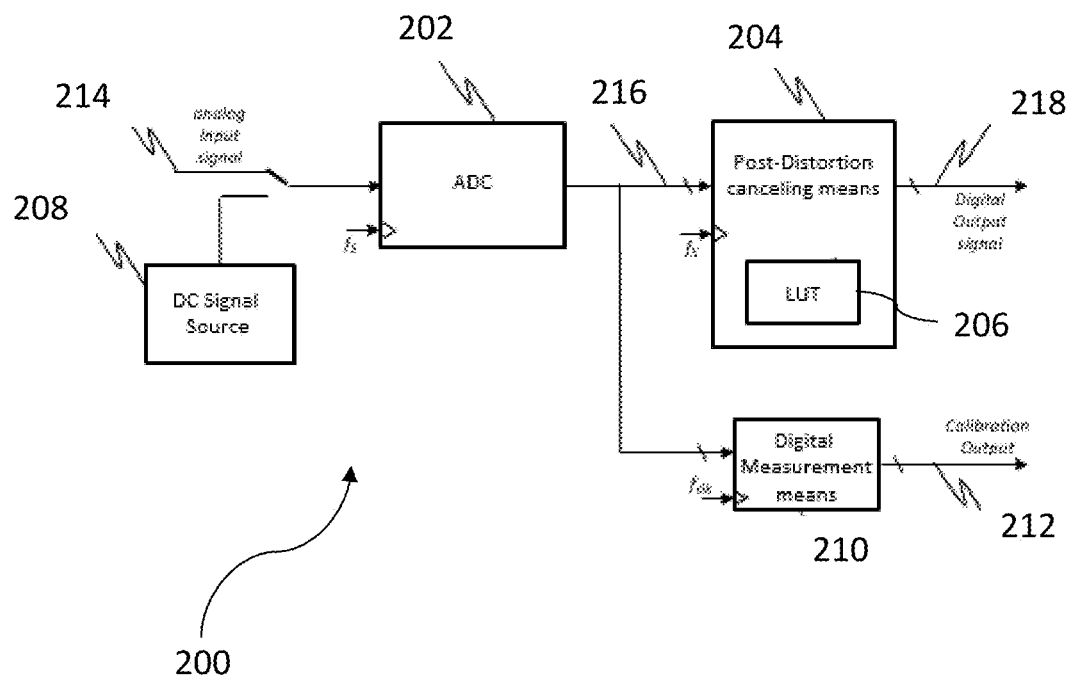
FIG. 2 illustrates a diagram of an integrated circuit with a digitally-corrected analog-to-digital converter (ADC) in accordance with an embodiment.

FIG. 2 illustrates a diagram of an integrated circuit 200 with a digitally-corrected analog-to-digital converter (ADC) 202 in accordance with an embodiment. In one embodiment, the ADC 202 is any of a discrete-time ADC, a continuous-time ADC, a VCO-based ADC, and an ADC with two VCOs configured in a differential configuration. In order to compensate for the nonlinear Quantiser characteristic of the ADC 202, a digital post-distortion cancelling mechanism 204 is coupled to the ADC 202. In one embodiment, the digital post-distortion cancelling unit 204 is externally coupled to the ADC 202 and in another embodiment, is integrated within the ADC 202 itself.

In one embodiment, the digital post-distortion cancelling unit 204 includes a digital lookup table (LUT) 206. To correctly cancel the distortion, correction coefficients are stored in the LUT 206. The correction coefficients are obtained by measuring the ADC response to a plurality of analog DC signals applied to an ADC input of the ADC 202. In one embodiment, any suitable regression analysis may be used to determine the correction coefficients including but not limited to ordinary least squares analysis and linear regression. The integrated circuit 200 further includes a DC signal source 208 that generates a plurality of DC calibration signals. In one embodiment, the DC signal source 208 is built using a high-precision digital-to-analog converter (DAC).

In one embodiment, the integrated circuit 200 includes a digital measurement unit 210 that measures the response of the ADC 202 during calibration using a clock frequency ($f_{clk}$). During calibration, a DC signal provided by the DC signal source 208 is converted into a digital format by the ADC 202 and is then measured by the digital measurement unit 210. The resulting measurement comprises a calibration output 212. In one embodiment, a plurality of calibration outputs are measured and stored in the LUT 206. The calibration output measurements enable the measurement of a nonlinear DC transfer characteristic of the ADC 202. In one embodiment, a test-signal generator is arranged to be connected via a first switch to the ADC 202 for which the nonlinear DC transfer characteristics are to be measured.

After the calibration period, and during normal operation, an analog input signal 214 is converted into digital format by the ADC 202. The resulting digital signal 216 is further processed by a post-distortion cancelling mechanism of the post-distortion cancelling unit 204 using a sampling frequency ($f_s$). In one embodiment, the post-distortion cancelling mechanism exhibits a nonlinear signal transfer characteristics that compensates for the nonlinear characteristic of the ADC 202. As a result, the overall DC-transfer characteristic is linear and the corrected digital output signal is available at node 218.

Figure 3A:
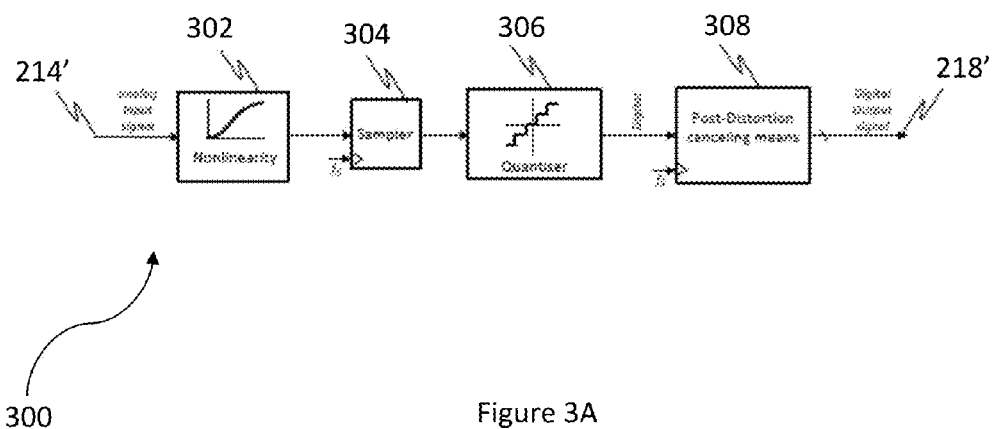
FIG. 3A illustrates a signal flow diagram of an integrated circuit with a digitally-corrected ADC in accordance with a first embodiment.

FIG. 3A illustrates a signal flow diagram of an integrated circuit 300 with a digitally-corrected ADC in accordance with a first embodiment. A signal flow between the analog input signal 214' and the digital output signal 218' passes through each of the components of the integrated circuit 300. The analog input signal 214' is applied to a nonlinearity unit 302 that represents the ADC nonlinear characteristic and outputs a resulting signal. In one embodiment, the analog input signal 214' is a time varying input signal. In one embodiment, the nonlinearity unit 302 comprises a nonlinearity generator. The resulting signal is sampled at a sampling frequency ($f_s$) using a sampler clock 304 and then is quantized by an ideal multi-bit Quantiser unit 306 resulting in a digital signal. In another embodiment, the Quantiser unit 306 is a different type of multi-bit Quantiser unit.

In FIG. 3A, the distortion cancelling of the resulting digital signal is performed by a post-distortion cancelling unit 308 to provide the digital output signal 218' which ends the signal flow. In one embodiment, the post-distortion cancelling unit 308 comprises a post-distortion canceller. In one embodiment, the post-distortion canceller (or corrector) comprises a processor, a memory, and logic elements integrated on a chip with the ADC, and further comprises a look-up table (LUT), an interpolator, and a digital adder. The post-distortion cancelling unit 308 implements a nonlinear characteristic that compensates for the nonlinearities (or nonlinear characteristics) introduced by the nonlinearity unit 302.

In one embodiment, the nonlinearity unit 302 alone represents the ADC of the integrated circuit 300. In another embodiment, the nonlinearity unit 302, the sampler clock 304, the ideal multi-bit Quantiser unit 306, and the post-distortion cancelling unit 308 are all housed within the ADC of the integrated circuit 300. In another embodiment, only the nonlinearity unit 302, the sampler clock 304, and the ideal multi-bit Quantiser unit 306 are housed within the ADC which is coupled to an external post-distortion cancelling unit 308 within the integrated circuit 300. In another embodiment, each of the components 302-308 are separate components coupled together with the integrated circuit 300.

Figure 3B:
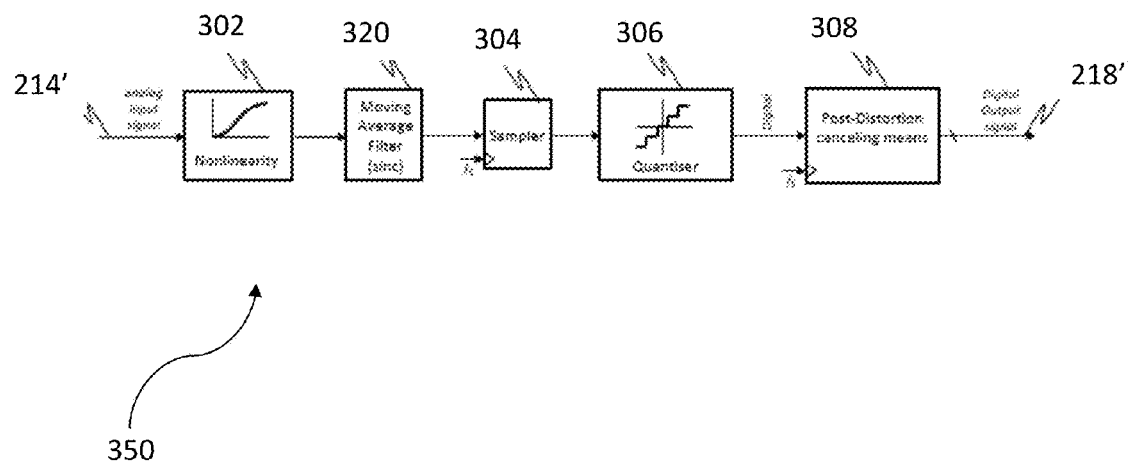
FIG. 3B illustrates a signal flow diagram of an integrated circuit with a digitally-corrected ADC in accordance with a second embodiment.

The ADC can also filter the inputted signal before the post-distortion cancelling mechanism is applied to compensate for the nonlinearities. FIG. 3B illustrates a signal flow diagram of an integrated circuit 350 with a digitally-corrected ADC in accordance with a second embodiment. A signal flow between the analog input signal 214' and the digital output signal 218' passes through each of the components of the integrated circuit 350. In FIG. 3B, the integrated circuit 350 has similar components as the integrated circuit 300 illustrated by FIG. 3A including the nonlinearity unit 302, the sampler clock 304, the multi-bit Quantiser unit 306, and the post-distortion cancelling unit 308.

In addition to the components of the integrated circuit 300, the integrated circuit 350 further includes a moving average filter unit 320 for the signal to pass through after passing through the nonlinearity unit 302. In one embodiment, the moving average filter unit 320 comprises a sinc-filter. In the signal flow illustrated by FIG. 3B, the time-varying input signal (or analog input signal 214') might cause distortion signal components that are not completely cancelled by the post-distortion cancelling unit 308.

In one embodiment, the nonlinearity unit 302 alone represents the ADC of the integrated circuit 350. In another embodiment, the nonlinearity unit 302, the moving average filter 320, the sampler clock 304, the ideal multi-bit Quantiser unit 306, and the post-distortion cancelling unit 308 are all housed within the ADC of the integrated circuit 350. In another embodiment, only the nonlinearity unit 302, the moving average filter 320, the sampler clock 304, and the ideal multi-bit Quantiser unit 306 are housed within the ADC which is coupled to an external post-distortion cancelling unit 308 within the integrated circuit 350. In another embodiment, each of the components 302-308 and 320 are separate components coupled together with the integrated circuit 350.

Figure 4A:
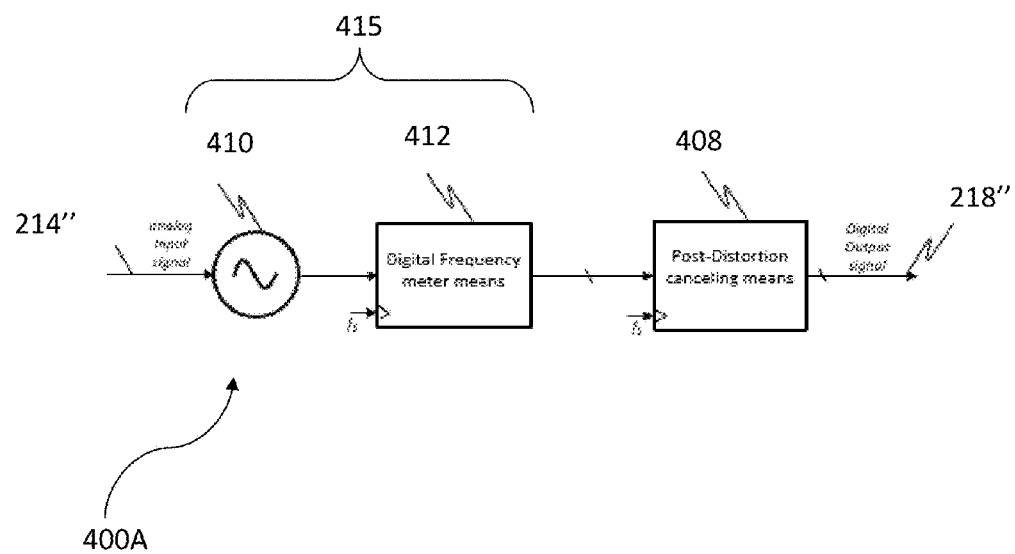
FIG. 4A illustrates a schematic of an integrated circuit with a digitally-corrected voltage controlled oscillator (VCO)-based ADC in accordance with a third embodiment.

A VCO-based ADC is an example of an ADC that exhibits a sinc-filter characteristic. FIG. 4A illustrates a schematic of an integrated circuit 400A with a digitally-corrected voltage controlled oscillator (VCO)-based ADC 415 in accordance with a third embodiment. A signal flow between the analog input signal 214" and the digital output signal 218" passes through the integrated circuit 400A that includes the digitally controlled VCO-based ADC 415. The VCO-based ADC 415 includes one or more VCOs 410.

The analog-to-digital conversion is performed by applying the analog input signal 214" to the inputs of the one or more VCOs 410 and by measuring the VCO output frequencies using a mechanism of a digital frequency meter unit 412. In one embodiment, the VCO-based ADC 415 further includes the digital frequency meter unit 412 that utilizes one or more phase measuring mechanisms to measure the VCO output frequencies. In another embodiment, the digital frequency meter unit 412 is externally coupled to the VCO-based ADC 415 and is integrated within the integrated circuit 400A. The measured VCO output frequencies of the VCO-based ADC 415 are then passed to the post-distortion cancelling unit 408 which provides the digital output signal 218".

Figure 4B:
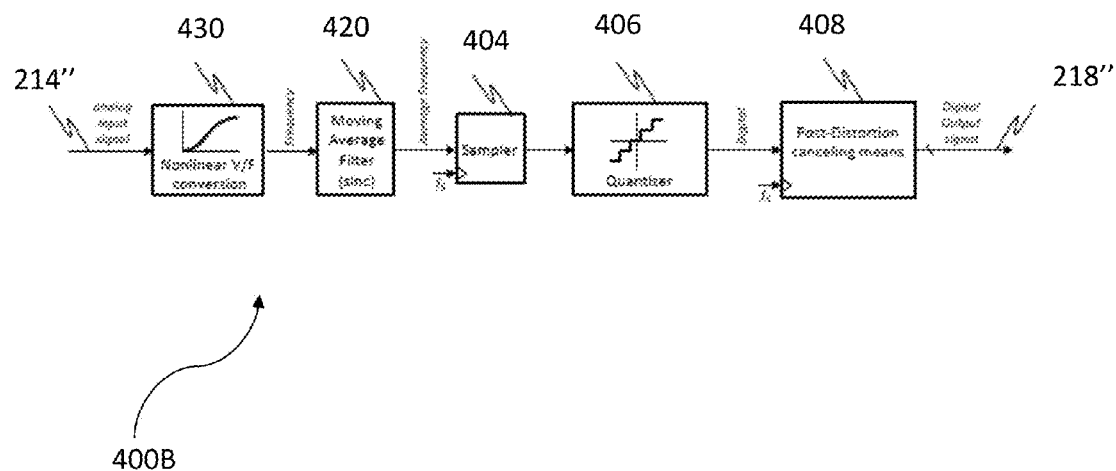
FIG. 4B illustrates a signal flow diagram of an integrated circuit with a digitally-corrected VCO-based ADC in accordance with the third embodiment.

In general, the VCO voltage-to-frequency characteristic is nonlinear, resulting in a nonlinear characteristic overall for the VCO-based ADC 415. The nonlinear characteristic can be compensated for by using the post-distortion cancelling mechanism of the post-distortion cancelling unit 408 that is similar to the post-distortion cancelling unit 308 of FIGS. 3A-3B. FIG. 4B illustrates a signal flow diagram of an integrated circuit 400B with a digitally-corrected VCO-based ADC in accordance with the third embodiment. A signal flow between the analog input signal 214" and the digital output signal 218" passes through each of the components of the integrated circuit 400B. In FIG. 4B, the integrated circuit 400B has similar components to the integrated circuit 350 of FIG. 3B including the moving average filter (e.g., sinc-filter) 420, sampler clock 404, the multi-bit Quantiser unit 406, and the post-distortion cancelling unit 408.

However, in FIG. 4B, the integrated circuit 400B has a nonlinearity unit 430 that differs from the nonlinearity unit 302 of FIG. 3B. The nonlinearity unit 430 comprises a VCO-based ADC that utilizes a voltage-to-frequency (V/F) converter unlike the nonlinearity unit 302 of FIG. 3B which comprises a different type of ADC. In one embodiment, the nonlinearity unit 430 comprises the VCO-based ADC 415 that is illustrated by FIG. 4A.

In FIG. 4B, the signal flow inputs the analog input signal 214" to the nonlinearity unit 430 and the resulting frequency is averaged over one sampling clock period by the moving average filter 420. The resulting average frequency is sampled by the sampler clock 404 and then is quantized by the ideal multi-bit Quantiser 406. Distortion canceling is performed by the post-distortion cancelling unit 408. The post-distortion cancelling unit 408 implements a nonlinear characteristic that compensates for the nonlinearities introduced by the non-linearity unit 430. However, due to the presence of the moving average filter 420, the signal spectrum at the input of the post-distortion cancelling unit 408 can differ significantly from the signal at the output of the nonlinearity unit 430. This is the root cause of an incomplete or imperfect cancellation of signal distortion components due to the presence of a sinc-filter as aforementioned.

Figure 5A:
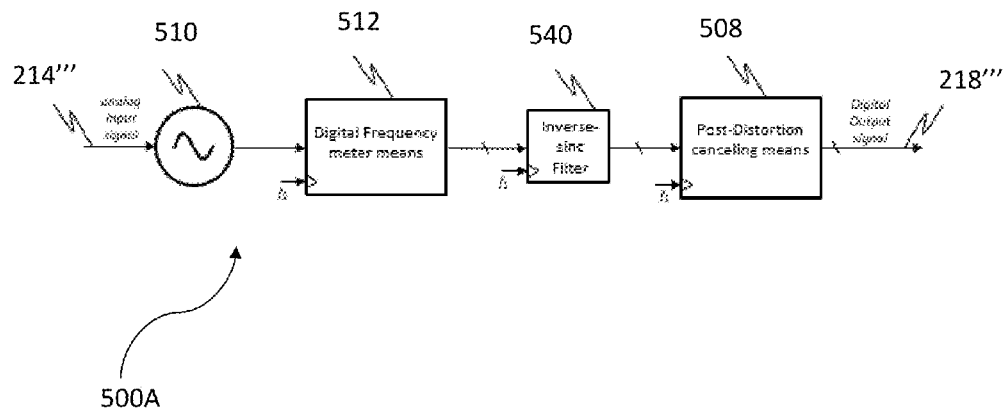
FIG. 5A illustrates a schematic of an integrated circuit with a digitally-corrected VCO-based ADC in accordance with a fourth embodiment.

To address incomplete cancellation, the integrated circuit can include an additional digital filter unit. FIG. 5A illustrates a schematic of an integrated circuit 500A with a digitally-corrected VCO-based ADC in accordance with a fourth embodiment. A signal flow between the analog input signal 214''' and the digital output signal 218''' passes through the integrated circuit 500A. The integrated circuit 500A includes similar components to the integrated circuit 400A including a VCO-based ADC that comprises one or more VCOs 510, a digital frequency meter unit 512, and a post-distortion cancelling unit 508. In addition, the integrated circuit 500A includes an inverse-sinc filter 540 that is inserted in between the VCO-based ADC and the post-distortion cancelling unit 508.

Figure 5B:
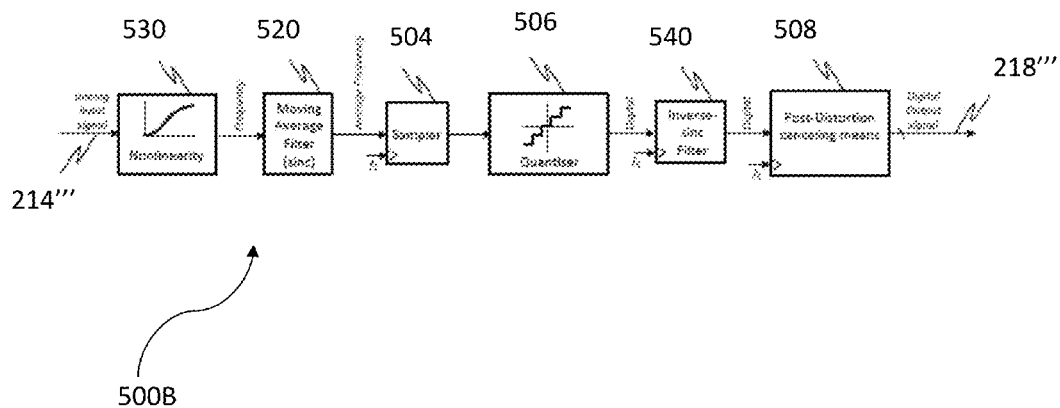
FIG. 5B illustrates a signal flow diagram of an integrated circuit with a digitally-corrected VCO-based ADC in accordance with the fourth embodiment.

In one embodiment, the inverse-sinc filter 540 implements a signal filter characteristic that is essentially inverse to the filtering characteristic of the moving average filter (elements 320 and 420 from FIGS. 3B and 4B, respectively). The filtering function of the inverse-sinc filter 540 is given by the following equation $$|H(f)| = \frac{\pi \cdot f / f_s}{|\sin(\pi \cdot f / f_s)|} = 1/\text{sinc}(\pi \cdot f / f_s) \quad (2)$$

which is the inverse of the equation (1). FIG. 5B illustrates a signal flow diagram of an integrated circuit 500B with a digitally-corrected VCO-based ADC in accordance with the fourth embodiment. The inverse-sinc filter 540 compensates for the signal filtering that happens in the moving average filter 520. Therefore, the input signal of the post-distortion cancelling unit 508 has the same signal spectrum as the output signal of the nonlinearity unit 530, except for the Quantisation noise introduced by the Quantiser unit 506.

However, since the Quantiser unit 506 is a multi-bit Quantiser, Quantisation noise is very small compared to the full-scale ADC output signal from the nonlinearity unit 530. Therefore, in this embodiment and unlike the previous embodiments, the post-distortion cancelling unit 508 perfectly and/or completely performs cancellation or compensation of the signal distortion components generated by the nonlinear voltage-to-frequency conversion ADC device (nonlinearity unit 530), even for time-varying input signals.

Figure 6:
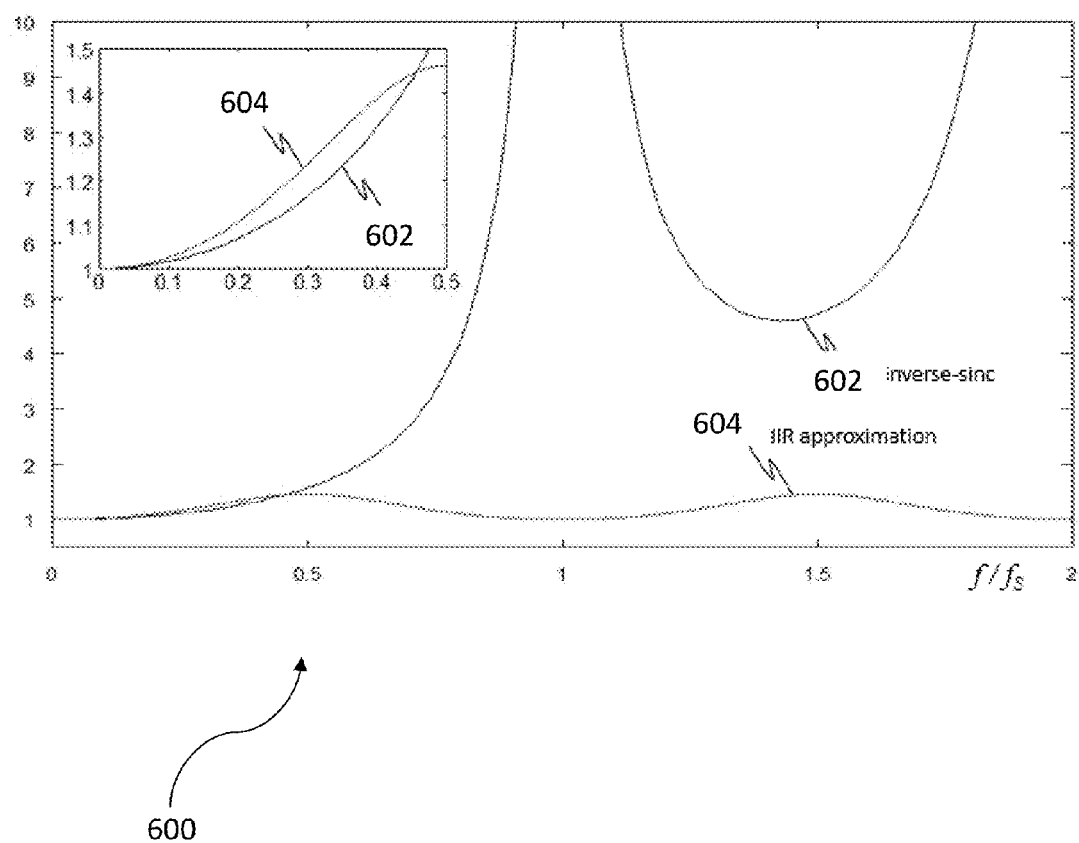
FIG. 6 illustrates a diagram of an inverse-sinc filter characteristic and its approximation that are each associated with a filtering function in accordance with an embodiment.

FIG. 6 illustrates a diagram 600 of an inverse-sinc filter characteristic 602 and its approximation 604 that are each associated with a filtering function in accordance with an embodiment. The inverse-sinc filter characteristic 602 cannot be realized by means of a digital filter because a digital filter can only approximate the inverse-sinc filter characteristic over the frequency interval [0: $f_s/2$]. Therefore, an inverse-sinc filter characteristic approximation 604 is given by the following equation:

$$|H(f)| = \left|\frac{1.1875}{1 + 0.1875 \cdot z^{-1}}\right|$$

where $z = e^{j2\pi f/f_s}$. In one embodiment, the approximation is determined using a digital Infinite-Impulse-Response Filter (IIR filter). Therefore, the IIR filter is a potential approximation and a replacement of the inverse-sinc filter.

Figure 7:
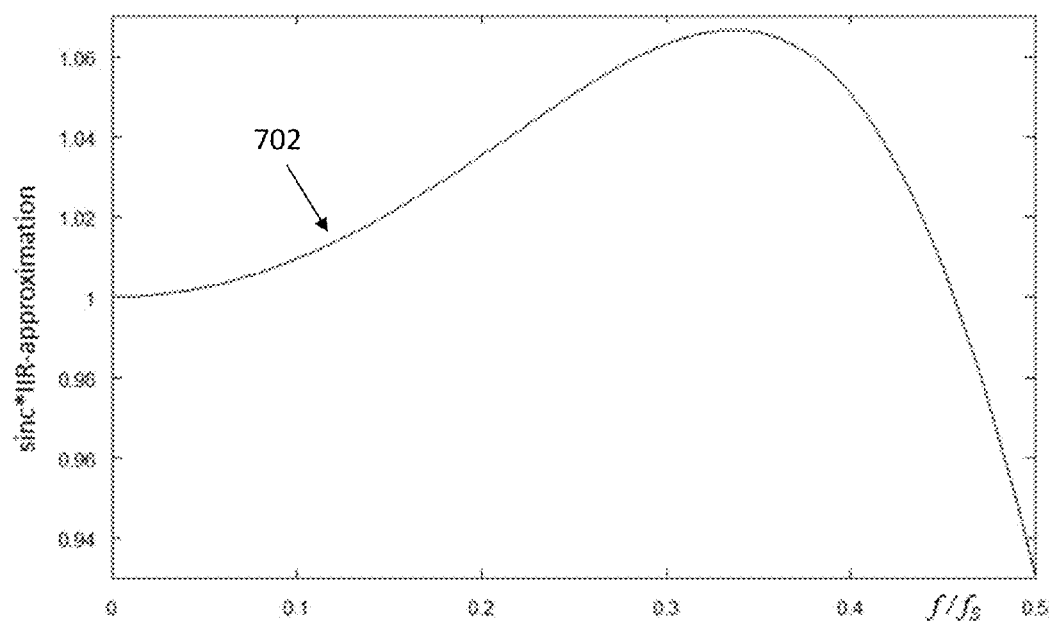
FIG. 7 illustrates a diagram of a sinc-filter function and the IIR-filter approximation in accordance with an embodiment.
Figure 7:
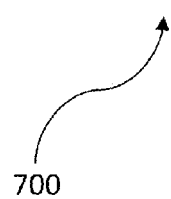

FIG. 7 illustrates a diagram 700 of a product 702 of a sinc-filter function and the IIR-filter approximation in accordance with an embodiment. The diagram 700 shows the accuracy of the IIR-filter approximation. The sinc-filter function is illustrated by FIG. 1 and the IIR-filter approximation is illustrated by element 604 of FIG. 6. The product 702 should be equal to one but due to non-ideal approximation, the product 702 varies over a range from 0.93 to 1.07. Unwanted signal components due to nonlinear distortion can be eliminated by the aforementioned post-distortion cancelling units to within a precision of +−7%. The precision corresponds to an attenuation of unwanted distortion signal components of at least 23 decibel (dB). In another embodiment, more precise IIR-filter approximations are generated by using more complex digital filter circuits for the inverse-sinc filter 540.

Figure 8:
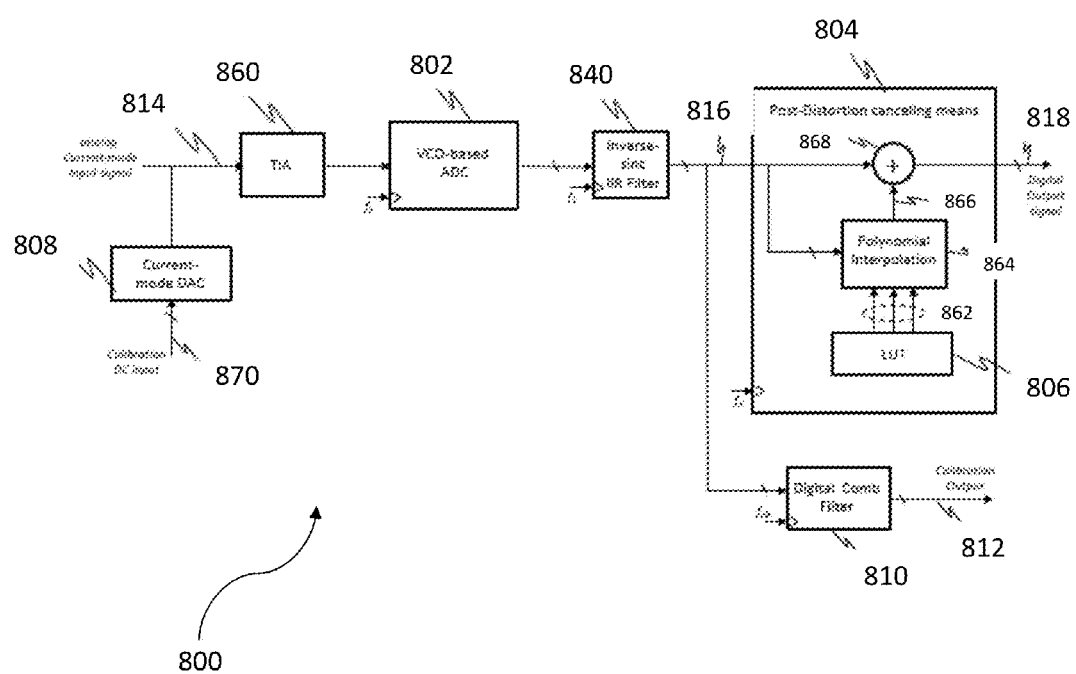
FIG. 8 illustrates a diagram of an integrated circuit with a digitally-corrected analog-to-digital converter (ADC) in accordance with another embodiment.

FIG. 8 illustrates a diagram of an integrated circuit 800 with a digitally-corrected VCO-based ADC 802 in accordance with another embodiment. In one embodiment, the integrated circuit 800 is part of an RF receiver frontend. In order to compensate for the nonlinear Quantiser characteristic of the VCO-based ADC 802, a digital post-distortion cancelling mechanism 804 is coupled to the VCO-based ADC 802.

In one embodiment, the digital post-distortion cancelling unit 804 includes a digital lookup table (LUT) 806. To correctly cancel the distortion, correction coefficients are stored in the LUT 806. The correction coefficients are obtained by measuring the ADC response to a plurality of analog DC signals applied to an ADC input of the VCO-based ADC 802. The integrated circuit 800 further includes a DC signal source 808 that generates a plurality of DC calibration signals. In one embodiment, the DC signal source 808 is built using a high-precision digital-to-analog converter (DAC) including but not limited to a current-mode DAC.

In one embodiment, the integrated circuit 800 includes a digital measurement unit 810 that measures the response of the VCO-based ADC 802 during calibration using a clock frequency ($f_{clk}$). In one embodiment, the digital measurement unit 810 is a digital comb filter. During calibration, a circuit unit preceding a transimpedance amplifier (TIA) (860) forces an analog input signal 814 to be equal to zero. In one embodiment, the analog input signal 814 is an analog current-mode input signal.

The DC signal source 808 (or current-mode DAC) provides a calibration signal to the TIA 860 input. The DC signal source 808 and the generated calibration signal are driven by a calibration DC input signal 870. The calibration signal is converted into a digital format by the VCO-based ADC 802 and a resulting signal 816 is then measured by the digital measurement unit 810 (or digital comb filter). The digital measurement unit 810 performs an averaging of the resulting signal 816 thereby attenuating the ADC Quantisation noise during the calibration procedure.

The resulting measurement comprises a calibration output 812 at a node. In one embodiment, a plurality of calibration outputs are measured and stored in the LUT 806. The calibration output measurements enable the measurement of a nonlinear DC transfer characteristic of the VCO-based ADC 802.

After the calibration period, and during normal operation, an analog input signal 814 is connected to a transimpedance amplifier (TIA) 860 where it is converted to voltage-mode. The voltage-mode signal is then converted into digital format by the VCO-based ADC 802. In addition, the resulting output signal from the VCO-based ADC 802 is inputted into the inverse-sinc IIR filter 840 for filtering. The IIR filter performs an approximation of the inverse-sinc filter characteristic as illustrated by FIG. 6.

The resulting signal 816 that is outputted is further processed by a post-distortion cancelling mechanism of the post-distortion cancelling unit 804 using a sampling frequency ($f_s$) and is also applied to the digital measurement unit 810. The post-distortion cancelling unit 804 includes the lookup table 806 that contains correction coefficients 862. The post-distortion cancelling unit 804 performs a polynomial interpolation 864 on the resulting signal 816 using the correction coefficients 862 to produce an error correction signal 866. The error correction signal 866 is added to the resulting signal 816 using signal addition mechanism which results in a corrected digital output signal 818.

A method and system in accordance with the present invention provides an apparatus which is a digitally-corrected analog-to-digital converter (ADC). The apparatus comprises a nonlinearity generator that generates one or more nonlinear characteristics of a time varying input signal and that causes unwanted signal components at frequencies other than a frequency of the time varying input signal, a frequency response modifier coupled to the nonlinearity generator that modifies the unwanted signal components using amplitude alteration (or by altering an amplitude of the unwanted signal components), a frequency response compensator coupled to the frequency response modifier, wherein the frequency response compensator compensates for the modification introduced by the frequency response modifier to provide a filtered digital signal, and an inverse nonlinearity generator coupled to the frequency response compensator for receiving the filtered digital signal, wherein the inverse nonlinearity generator compensates for the one or more nonlinear characteristics.

In another embodiment, the apparatus further comprises a sampler clock coupled to the frequency response modifier for sampling the time varying input signal to provide a sampled signal and a Quantiser unit coupled between the sampler clock and the frequency response compensator, wherein the Quantiser unit quantizes the sampled signal to provide a digital signal that is filtered by the frequency response compensator to provide the filtered digital signal.

In one embodiment, the frequency response modifier comprises a moving average filter and the frequency response compensator comprises an inverse filter that compensates for the modification introduced by the moving average filter using a filtering characteristic of the inverse filter that is the inverse of a filtering characteristic of the moving average filter. In one embodiment, the moving average filter comprises a sinc filter and the frequency response compensator comprises an inverse sinc filter, wherein the inverse sinc filter compensates for the modification using a first filtering characteristic of the inverse sinc filter that is the inverse of a second filtering characteristic of the sinc filter.

In one embodiment, the nonlinearity generator is within an analog to digital converter (ADC) that is any of a voltage controlled oscillator (VCO)-based ADC, a continuous-time ADC, a discrete-time ADC, and two voltage controlled oscillators (VCOs) configured in a differential configuration. In one embodiment, the frequency response compensator comprises a digital Infinite Impulse Response (IIR) filter that comprises a digital first-order IIR filter.

In one embodiment, the inverse nonlinearity generator comprises a post-distortion canceller that includes a digital lookup table containing correction coefficients. The post-distortion canceller performs a polynomial interpolation using the correction coefficients to provide an error correction signal and the error correction signal is added to a signal inputted into the post-distortion canceller to provide a corrected digital output signal.

In one embodiment, the nonlinearity generator of the apparatus comprises a first and a second set of nonlinearity generators and the frequency response modifier of the apparatus comprises a first and a second set of frequency response modifiers. A first signal associated with the first set of nonlinearity generators corresponds to a second signal with an inverse nonlinearity characteristic associated with the second set of nonlinearity generators. Furthermore, a third signal associated with the first set of frequency response modifiers corresponds to a fourth signal with an inverse frequency characteristic associated with the second set of frequency response modifiers. Thus, a signal order of each of the second sets is inverse to a signal order of each of the first sets.

In this embodiment, a cascade of two nonlinearity generators and frequency response modifiers is corrected with the inner nonlinearity being corrected first and then the outer nonlinearity being corrected second. Specifically, the apparatus includes a first cascade of a number of signal nonlinearity generators and signal frequency response modifiers, in any order, followed by a second cascade of nonlinearity generators and signal frequency response modifiers. Each signal nonlinearity generator in the first cascade corresponds to a signal nonlinearity generator in the second cascade with essentially inverse nonlinearity characteristic. Each signal frequency response modifier in the first cascade corresponds to a signal frequency response modifier in the second cascade with essentially inverse frequency characteristic. The order of signal nonlinearity generators and signal frequency response modifiers in the second cascade is inverse to the order in the first cascade.

As above described, a method and system in accordance with the present invention provides for a digitally-corrected analog-to-digital converter (ADC) by providing both a moving average filter (e.g., sinc-filter) and an inverse-sinc filter (e.g., IIR filter) within an integrated circuit that further includes a nonlinearity unit (e.g., nonlinearity generator or VCO-based ADC) and a post-distortion cancelling unit (e.g., post-distortion canceller).

By integrating an additional filter (inverse-sinc filter) to compensate and correct the changes that result in the original analog signal that passes through the first filter (e.g., moving average signal), the method and system in accordance with the present invention provide for perfect and/or complete (as previously defined) distortion cancellation. Therefore, the distortion components that lead to incomplete cancellation issues are eliminated even when the integrated circuit includes the first filter.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus comprising:
   a nonlinearity generator that generates one or more nonlinear characteristics of a time varying input signal and that causes unwanted signal components at frequencies other than a frequency of the time varying input signal;
   a frequency response modifier coupled to the nonlinearity generator that modifies the unwanted signal components by altering an amplitude of the unwanted signal components;
   a frequency response compensator coupled to the frequency response modifier, wherein the frequency response compensator compensates for the modification introduced by the frequency response modifier and provides a filtered digital signal; and
   an inverse nonlinearity generator coupled to the frequency response compensator for receiving the filtered digital signal, wherein the inverse nonlinearity generator compensates for the one or more nonlinear characteristics.

2. The apparatus of claim 1, wherein the frequency response modifier comprises a moving average filter.

3. The apparatus of claim 2, wherein the frequency response compensator comprises an inverse filter.

4. The apparatus of claim 3, wherein the inverse filter compensates for the modification introduced by the moving average filter using a filtering characteristic of the inverse filter that is the inverse of a filtering characteristic of the moving average filter.

5. The apparatus of claim 2, wherein the moving average filter comprises a sinc filter and the frequency response compensator comprises an inverse sinc filter, wherein the inverse sinc filter compensates for the modification introduced by the sinc filter using a first filtering characteristic of the inverse sinc filter that is the inverse of a second filtering characteristic of the sinc filter.

6. The apparatus of claim 1, wherein the nonlinearity generator is within an analog to digital converter (ADC).

7. The apparatus of claim 6, wherein the ADC comprises a voltage controlled oscillator (VCO)-based ADC.

8. The apparatus of claim 6, wherein the ADC comprises a continuous-time ADC.

9. The apparatus of claim 6, wherein the ADC comprises a discrete-time ADC.

10. The apparatus of claim 6, wherein the ADC comprises two voltage controlled oscillators (VCOs) configured in a differential configuration.

11. The apparatus of claim 1, wherein the frequency response compensator comprises a digital Infinite Impulse Response (IIR) filter.

12. The apparatus of claim 11, wherein the digital IIR filter comprises a digital first-order IIR filter.

13. The apparatus of claim 1, wherein the inverse nonlinearity generator comprises a post-distortion canceller.

14. The apparatus of claim 13, wherein the post-distortion canceller includes a lookup table containing correction coefficients.

15. The apparatus of claim 14, wherein the post-distortion canceller performs a polynomial interpolation using the correction coefficients to provide an error correction signal.

16. The apparatus of claim 15, wherein the error correction signal is added to a signal inputted into the post-distortion canceller to provide a corrected digital output signal.

17. The apparatus of claim 1, wherein the nonlinearity generator comprises a first and a second set of nonlinearity generators and the frequency response modifier comprises a first and a second set of frequency response modifiers.

18. The apparatus of claim 17, wherein a first signal associated with the first set of nonlinearity generators corresponds to a second signal with an inverse nonlinearity characteristic associated with the second set of nonlinearity generators, and wherein a third signal associated with the first set of frequency response modifiers corresponds to a fourth signal with an inverse frequency characteristic associated with the second set of frequency response modifiers.

19. The apparatus of claim 18, wherein a signal order of each of the second sets is inverse to a signal order of each of the first sets.

20. The apparatus of claim 1, further comprising:
   a sampler clock coupled to the frequency response modifier for sampling the time varying input signal to provide a sampled signal; and
   a Quantiser unit coupled between the sampler clock and the frequency response compensator, wherein the Quantiser unit quantizes the sampled signal to provide a digital signal that is filtered by the frequency response compensator to provide the filtered digital signal.

* * * * *